(12) United States Patent
Karabatsos

(10) Patent No.: US 6,737,891 B2
(45) Date of Patent: May 18, 2004

(54) TRI-DIRECTIONAL, HIGH-SPEED BUS SWITCH

(76) Inventor: Chris Karabatsos, 42 Jumping Brook La., Kingston, NY (US) 12401

( * ) Notice: Subject to any disclaimer, the term of this patent is extended or adjusted under 35 U.S.C. 154(b) by 0 days.

(21) Appl. No.: 09/683,638

(22) Filed: Jan. 29, 2002

(65) Prior Publication Data
US 2002/0101261 A1 Aug. 1, 2002

Related U.S. Application Data
(60) Provisional application No. 60/265,356, filed on Feb. 1, 2001.

(51) Int. Cl.$^7$ ............................................. H03K 19/094
(52) U.S. Cl. .............................. 326/113; 326/82; 326/83
(58) Field of Search .................... 326/82, 83, 89, 326/113, 41

(56) References Cited

U.S. PATENT DOCUMENTS

| | | | |
|---|---|---|---|
| 6,020,776 A | * 2/2000 | Young | 327/408 |
| 6,233,650 B1 | 5/2001 | Johnson et al. | |
| 6,351,152 B1 | * 2/2002 | Reddy et al. | 326/105 |
| 6,420,981 B1 | * 7/2002 | Yu | 341/100 |
| 6,446,158 B1 | 9/2002 | Karabatsos | |

OTHER PUBLICATIONS

QMB10–22T38RL Data Sheet, Oct., 2001.

* cited by examiner

*Primary Examiner*—Anh Tran
(74) *Attorney, Agent, or Firm*—Mark P. White (57) ABSTRACT

A tri-directional, high-speed switching element connects to a bus port, an A memory port, and a B memory port. A first FET switch" source is connected to the bus port, and a second FET switch"s drain is connected to the A memory port, and its source is connected to the first FET switch"s drain. A third FET switch"s drain is connected to the B memory port, and its source is connected to the second FET switch"s drain. This element permits all three ports to be isolated from each other, or for the A and B ports to be interconnected, but isolated from the bus port, or for all ports to be connected together. A collection of 8 such switching elements is provided on a single silicon chip, providing switching for a byte of interleaved memory.

7 Claims, 13 Drawing Sheets

Fig. 1

FUNCTION TABLE

| ME | SB | BE CLK | C[0,7] | B[0,7] | A[0,7] | DQS $C_A$ | DQS $C_B$ | DQS A | DQS B | Mode |
|---|---|---|---|---|---|---|---|---|---|---|
| 1 | 0 | X | Hi-Z | A[0,7] | B[0,7] | Hi-Z | Hi-Z | Hi-Z | Hi-Z | Disable DIMM |
| 1 | 1 | X | Hi-Z | Hi-Z | Hi-Z | Hi-Z | Hi-Z | Hi-Z | Hi-Z | Disable DIMM |
| 0 | 0 | X | A[0,7] = B[0,7] = C[0,7] | | | DQS A | DQS B | DQS $C_A$ | DQS $C_B$ | C Write A or B |
| 0 | 1 | 0 | A[0,7] | Hi-Z | C[0,7] | DQS PU | DQS PD | Hi-Z | Hi-Z | C Read A |
| 0 | 1 | 1 | B[0,7] | C[0,7] | Hi-Z | DQS PD | DQS PU | Hi-Z | Hi-Z | C Read B |

PIN DESCRIPTION

| Name | I/O | Function |
|---|---|---|
| A0-4, B0-4 | I/O | Buses A, B |
| C0-4, D0-4 | I/O | Buses C, D |
| BE | I | Bus Switch Enable |
| BX | I | Bus Exchange |

FUNCTION TABLE

| BE | BX | A0-4 | B0-4 | Function |
|---|---|---|---|---|
| H | X | Hi-Z | Hi-Z | Disconnect |
| L | L | C0-4 | D0-4 | Connect |
| L | H | D0-4 | C0-4 | Exchange |

Fig. 5c

Prior Art

TRI-DIRECTIONAL, HIGH-SPEED BUS SWITCH

CROSS REFERENCE TO RELATED APPLICATIONS

This application claims priority based on Provisional Application No. 60/265,356, filed on Feb. 1, 2001, granted to Chris Karabatsos, and entitled "Tri-Directional FET Switch".

BACKGROUND OF THE INVENTION

The computer industry, with the advances of silicon technology, is constantly faced with the complexities of Data Buses. The high speed of microprocessor CPU requires high speed of data bus between the memory subsystem and the front end CPU data bus. Speed without density of memory is an unbalanced combination. The CPU by itself cannot increase performance and it does not perform at the speed it was designed for. A bottleneck is created between memory and CPU Front End bus. With advances of Internet, complex application programs and operating systems, memory subsystems with high-density memory modules have become a necessity. However, as the density of memory goes up so does the capacitive loading of each data bit of the data bus. With the increase of the capacitive loading on the data bus, the driver of the data bit line is taxed for higher driving capability. As is well known, when the capacitive loading on the data line increases, for a given driver capability, the speed by which the driver circuit can change state on the data line is decreasing. The two are inversely proportional.

Many schemes have been designed with emphasis in speed and density. For that purpose, circuits utilizing FET switches have been designed into the data path to reduce the capacitive loading and thus allow for increase in data speed.

There are several factors to be considered in the design of such circuits:

1) Data pulse widths in the nanosecond and sub nanosecond range.
2) Data bus width to satisfy wide Data Bus requirements of the CPU.
3) High Memory density on the same Data Bus (More Memory Modules attached to the same Data Bus, more connectors on the motherboard attached to the Bus.)
4) Presence of physical parameters of Resistance, Inductance and capacitance in the structure of the Data Bus and on the devices (Connectors, Memory modules, Printed circuit boards, Memory chips and logic chips connected to the Bus).
5) Effects of the physical RLC quantities affecting the overall speed by which data can be transported on the Bus and thus the overall performance and bandwidth of such Bus.
6) Synchronization of the Data signals and strobe signals required to latch the data at the destination receiver.

Figures 5A, 5B:
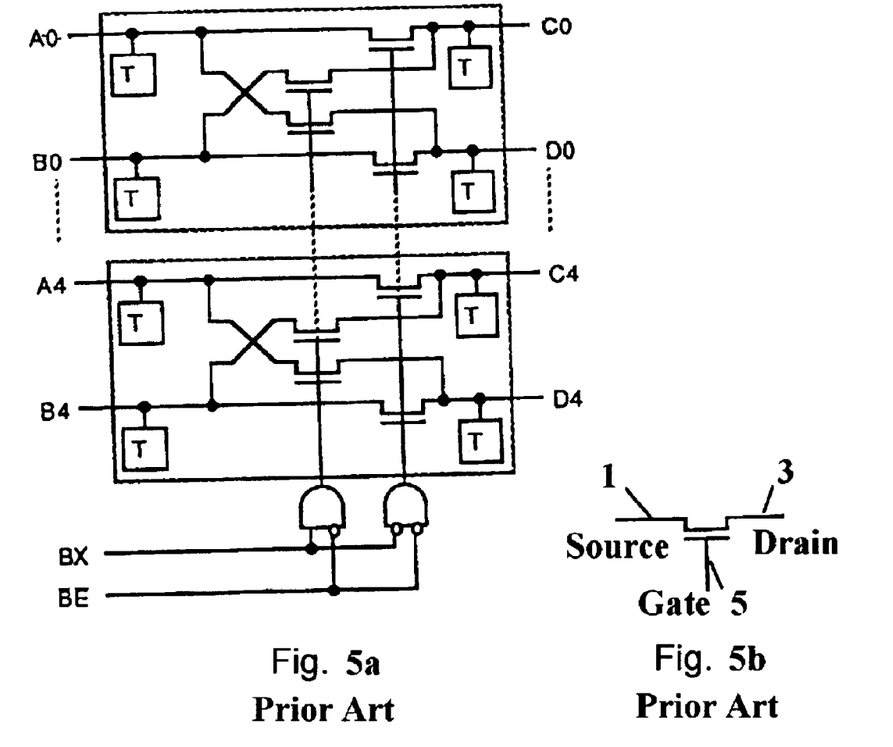
FIG. 5a depicts a schematic diagram of a prior art switching circuit.
FIG. 5b depicts the elements of a FET switch.

An example of a prior art approach for such switching circuits utilizing FET switches is shown in FIG. 5a. This circuit represents the High Speed CMOS Bus Exchange Switch, model QS3388, manufactured by Quality Semiconductor, Inc. The circuit utilizes a number of FET switches, a typical FET switch being shown in FIG. 5b.

Referring now to FIG. 5b, the FET switch is seen to have three terminals: the source 1, the drain 2, and the gate 5. When the FET switch is TRUE, the source and drain are in an ON state, that is, they are connected through a very low resistance, typically 5 ohms in the QS3388. A FALSE signal on the gate will cause the source to be essentially isolated from the drain, or at least, to present an extremely high resistance between the two, putting the FET switch into an OFF state. Most importantly, the transition between the ON and OFF states takes place in a fraction of a nanosecond.

The QS3388 is built upon a single silicon substrate, to maximize switching speed. It contains four sub-circuits, each of which contains an A port, a B port, a C port, and a D port. The A and B ports are intended for connection to A and B memory banks, while the C and D ports are intended for connection to C and D buses. Depending on the states of the control signals BX and BE, the C bus may be connected either to the A or the B bus, and the D bus may be connected to either of these two memory ports.

Figure 5C:
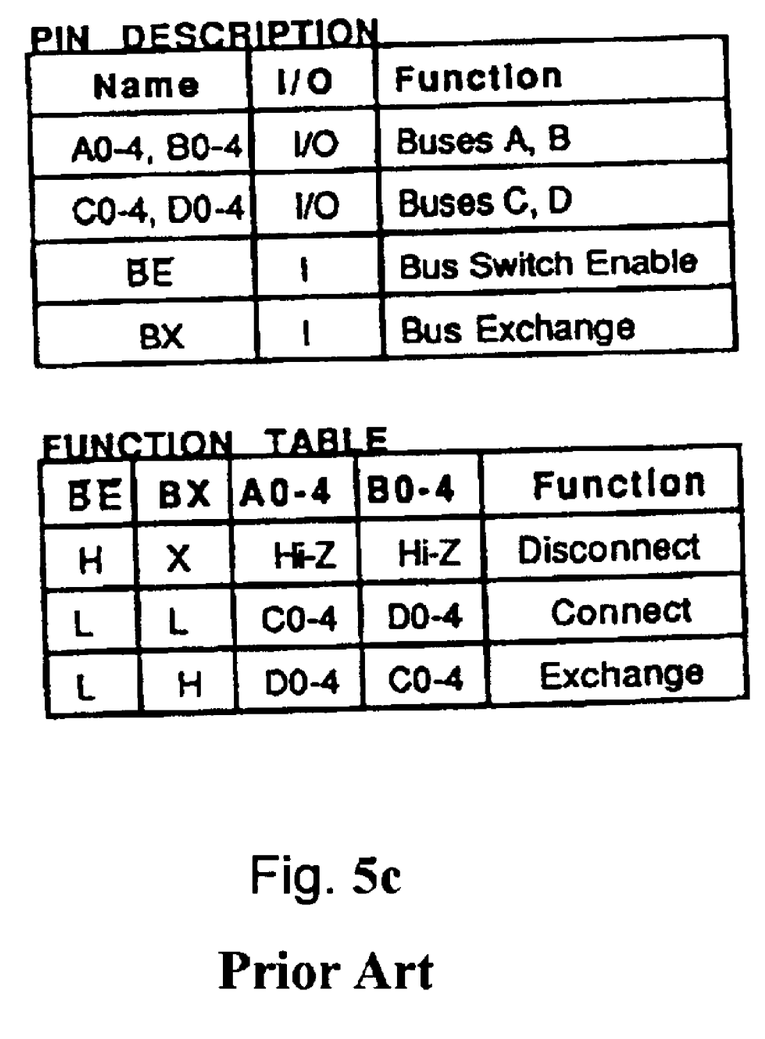
FIG. 5c depicts the pin descriptions of the circuit of FIG. 5a, and a truth table of said circuit.
Figure 6A:
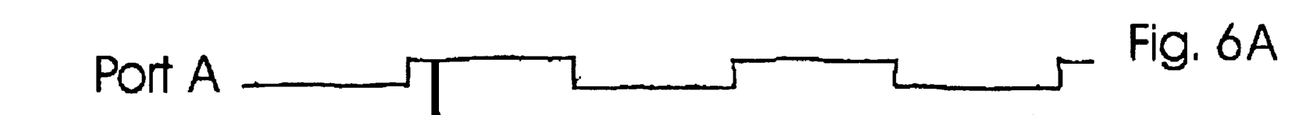
FIGS. 6a through 6i depict the waveforms generated by the circuit of FIG. 1 when the Master Enable Signal is FALSE, and data is read from one of the memory banks to the data bus.
Figure 6B:
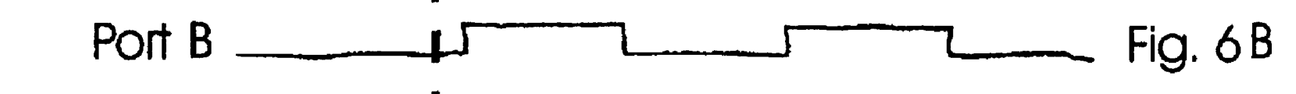
Figure 6C:
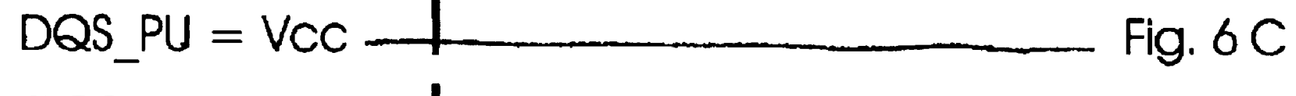
Figure 6D:
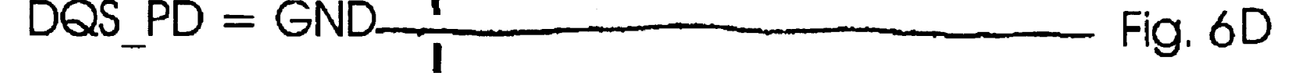
Figure 6E:
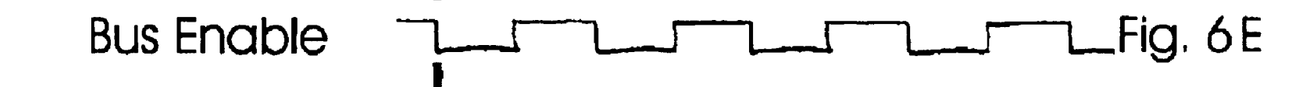
Figure 6F:
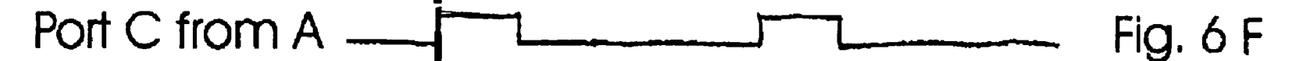
Figure 6G:
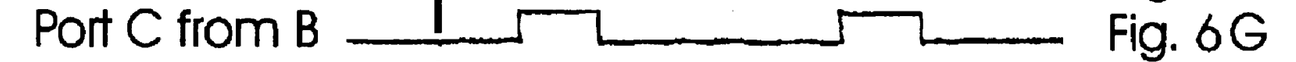
Figure 6H:
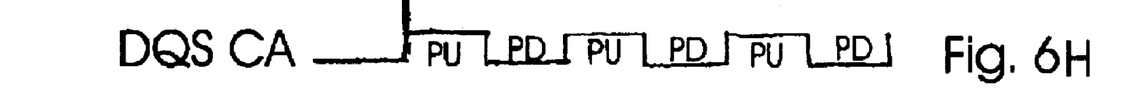
Figure 6I:
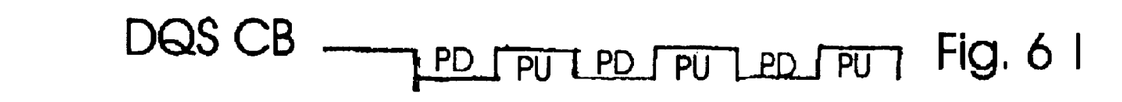

The Function Table or Truth Table, shown in FIG. 5c shows the various states of the circuits, dependent upon the states of the control signals.

The current invention, in comparison to the prior art, is a tri-directional high speed FET switch, implemented as an arrangement of FET switches built on the same silicon substrate to maximize speed and accurate control, and is intended for use with memory circuits. In its primary embodiment, this design provides eight sets of three ports each; a C port is intended for connection to the computer bus; an A port for connection to a bit of a first, or A memory bank; and a B port for connection to a bit of a second, or B memory bank.

Unlike the prior art, however, the present invention allows the bus not only to be connected to either the A or B memory bank; it also allows the A memory bank to be connected to the B memory bank, creating a "third state". It further produces a pair of strobe signals synchronized with the data signals on the A and B memory banks; and a pull-up and pull down signal, also synchronized with the data signals on the A and B memory banks.

The present invention, when used in a configuration described in U.S. patent Ser. No. 09/572,641, provides a significant improvement in memory access speed and accuracy, with substantial noise reduction over the prior art.

SUMMARY OF INVENTION

It is an object of the current invention to provide a microelectronic chip to act as a switching interface between a memory bank and the data bus of a computer memory system. It is a specific object to provide such a chip whose circuitry is implemented in accordance with an interleaved memory system architecture. It is a further specific object that said chip is implemented in accordance with a quad-speed memory architecture.

In accordance with a first aspect of the invention, a high-speed switching element includes a first port, Cn, a second port An, and a third port Bn, and wherein a first FET switch source is connected to Cn, a second FET switch source is connected to the first FET switch drain, and the drain of the second FET switch is connected to An, and a third FET switch source is also connected to the drain of the first FET switch, and the drain of the third FET switch is connected to Bn.

In accordance with a second aspect of the invention, a second high-speed switching element includes a first port DQS_CA, a second port DQS A, and a third port DQS_PU, a fourth port DQS_CB, a fifth port DQS B, and a sixth port DQS_PD. A fourth FET switch source is connected to DQS_CA, and a fifth, a sixth, and a seventh FET switch are included. The sources of the fifth, a sixth, and a seventh FET switches are connected together, and are connected to the drain of the fourth FET switch. Further, the drain of the fifth FET switch is connected to DQS_PU, the drain of the sixth FET switch is connected to DQS A, and the drain of the seventh FET switch is connected to DQS_PD. In addition, an eighth FET switch source is connected to DQS_CB, and a ninth, a tenth, and an eleventh FET switch are included, where the sources of the ninth, the tenth, and the eleventh FET switches are connected together, and are further connected to the drain of the eighth FET switch. Finally, the drain of the ninth FET switch is connected to DQS_PU, the drain of the tenth FET switch is connected to DQS B, and the drain of the eleventh FET switch is connected to DQS_PD.

In accordance with a third aspect of the invention, a high-speed, tri-directional switching circuit is made up of eight of the switching elements in accordance the first aspect of the invention, where the gates of the first FET switch of each switching element is connected to the gate of the first FET switch of every other switching element, where the gates of the second FET switch of each such switching element is connected to the gate of the second FET switch of every other switching element, and where the gates of the third FET switch of each switching element is connected to the gate of the third FET switch of every other switching element.

In accordance with a fourth aspect of the invention, the switching circuit contains logic circuitry operating on control signals ME, BE, such that when ME is TRUE and SB is FALSE, then: each C port is isolated from the rest of the circuit, each B port is connected to the corresponding A port, DQS_CA is isolated from the rest of the circuit, DQS_CB is isolated from the rest of the circuit, DQS A is isolated from the rest of the circuit, and DQS B is isolated from the rest of the circuit. When ME is TRUE and SB is TRUE, then each C port, each B port, the DQS_CA port, the DQS_CB port, the DQS A port and the DQS B port are all isolated from the rest of the circuit and when ME is FALSE and SB is FALSE, then each C port is connected to the corresponding A port, each B port is connected to the corresponding A port, and to the corresponding C port, DQS_CA is connected to the DQS A port, and DQS_CB is connected to the DQS B port. When ME is FALSE and SB is TRUE, and BE CLK is FALSE, then each C port is connected to the corresponding A port, each B port is isolated from the rest of the circuit, DQS_CA is connected to the DQS_PU port, DQS_CB is connected to the DQS_PD port, DQS A is isolated from the rest of the circuit, and DQS B is isolated from the rest of the circuit. When ME is FALSE and SB is TRUE, and BE CLK is TRUE, then:each C port is connected to the corresponding B port, each A port is isolated from the rest of the circuit, DQS_CA is connected to the DQS_PD port, DQS_CB is connected to the DQS_PU port, DQS A is isolated from the rest of the circuit, and DQS B is isolated from the rest of the circuit.

In accordance with a fifth aspect of the invention, the switching circuit is implemented by microelectronic techniques, and in the form of a single semiconductor chip.

BRIEF DESCRIPTION OF DRAWINGS

These, and further features of the invention, may be better understood with reference to the accompanying specification and drawings depicting the preferred embodiment, in which.

DETAILED DESCRIPTION

The present invention is used in conjunction with a high-speed computer memory system, such as that disclosed in U.S. patent application Ser. No. 09/572,641, filed on May. 17, 2002 by Chris Karabatsos, the inventor of the current invention. Said prior application Ser. No. 09/572,641 is incorporated herein by reference, in its entirety.

Figure 9:
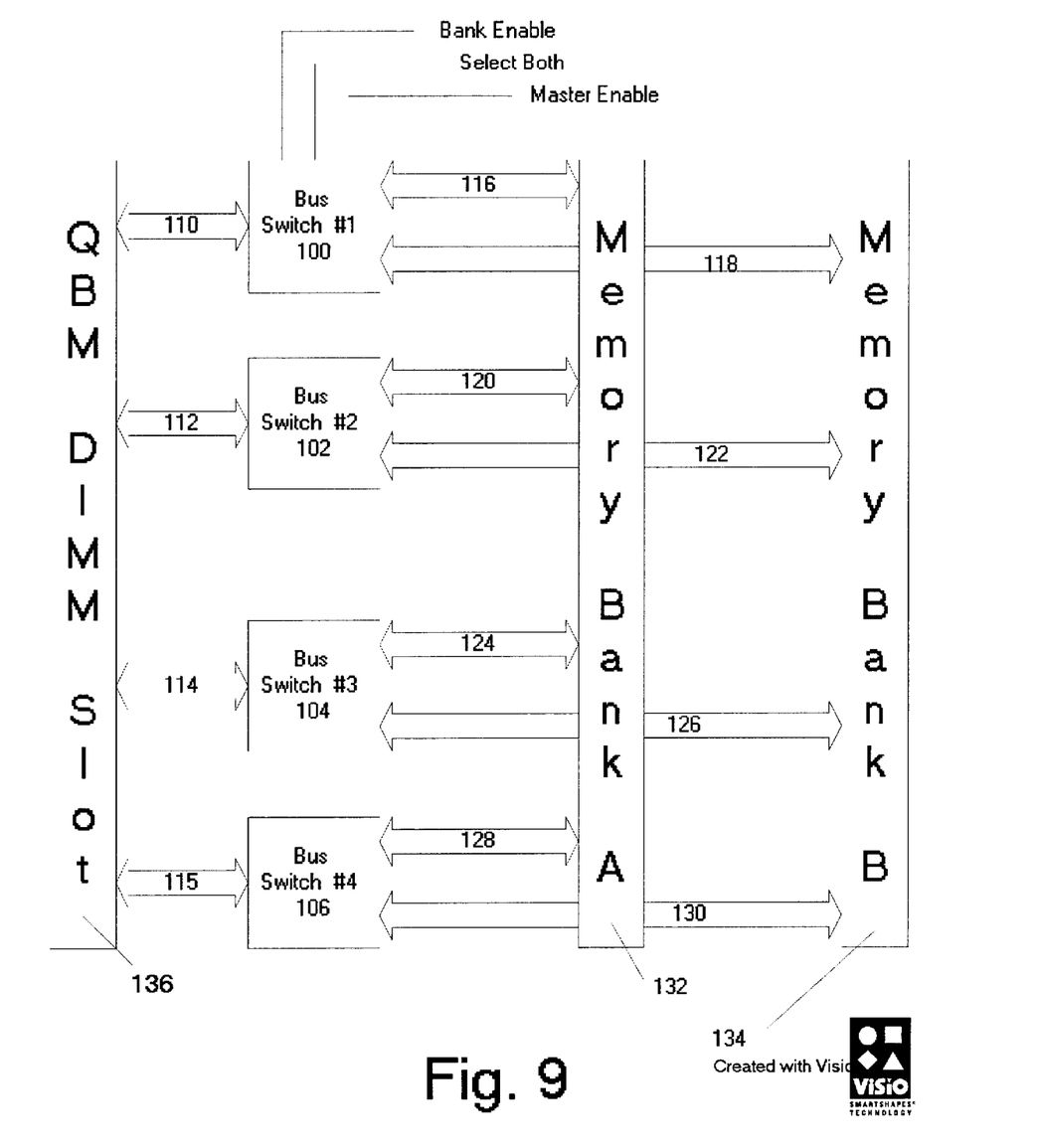
FIG. 9 depicts a memory system using the current invention as a bus switch.

An example of the use of the current invention is shown in FIG. 9, which depicts a memory module, contained on a single circuit board, used as part of an interleaved memory system. The module comprises Memory Bank A 132 and Memory Bank B 134, and makes the various ports, or terminals of the memory banks available to the computer bus through intermediate Bus Switches 100, 102, 104, and 106. In the Module of FIG. 9, the computer bus connects with the switches through a connector slot 136. The memory module depicted in this Figure is a DIMM style module, well known in the art.

The current invention is a high speed switching circuit for use in the module of FIG. 9, each such circuit performing the functions of each of the Bus Switches 100, 102,104, and 106. This circuit is implemented in the form of a single silicon microchip 38, and is shown in block diagram form in FIG. 12.

Figure 12:
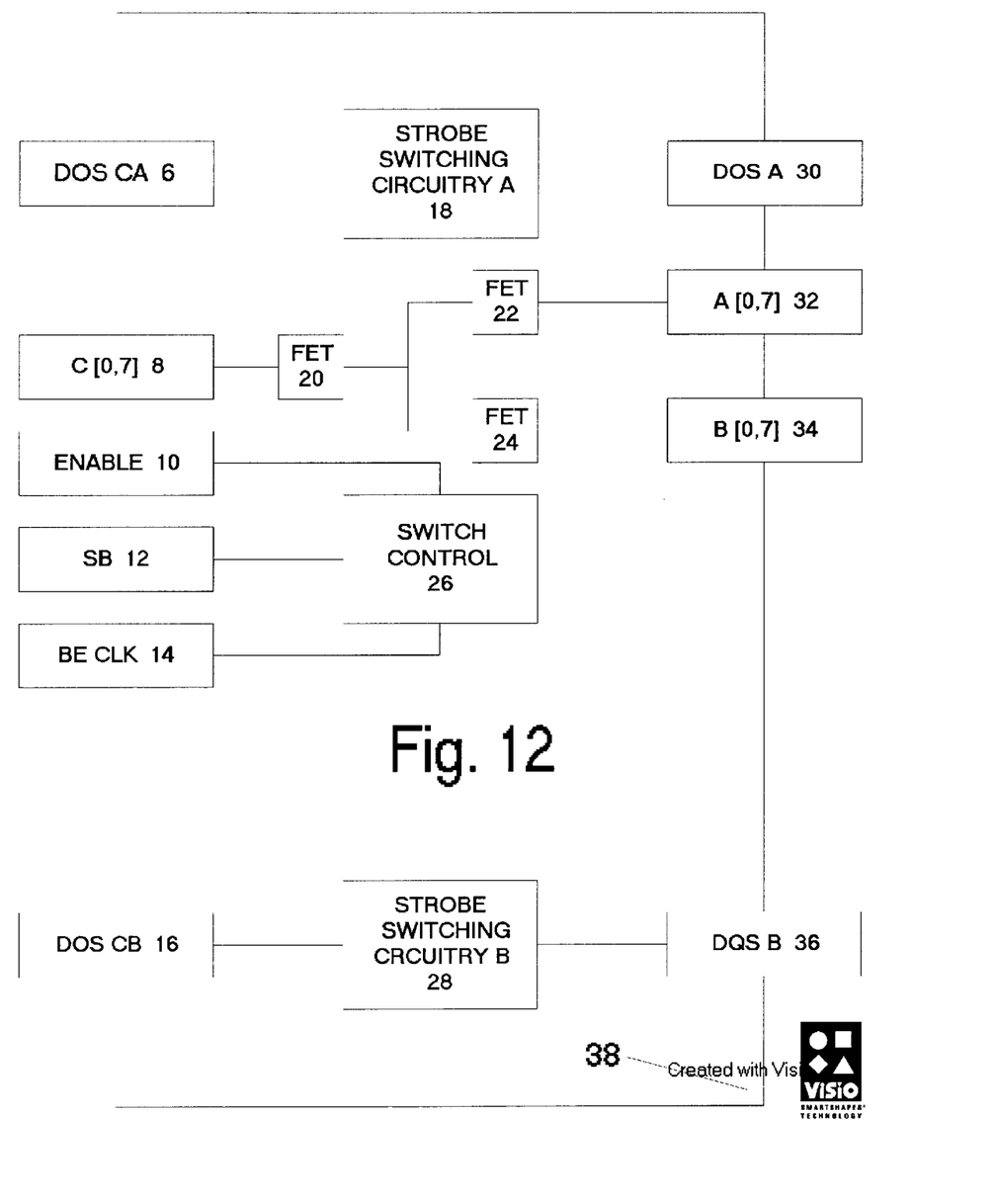
FIG. 12 depicts a block diagram form of the circuit of FIG. 1.

Referring now to FIG. 12, —the module comprises several sub-circuits. Strobe Switching Circuitry A produces a strobe signal on port DQS A as a result of processing input signal DQS CA, derived from the computer bus. DQS A is directed to memory bank A. Similarly, Strobe Switching Circuitry B produces a strobe signal on port DQS B as a result of processing input signal DQS CB, derived from the computer bus. DQS B is directed to memory bank B. DQS A and DQS B are used only in transferring data from port Cn to ports An and Bn during a write operation as shown and explained infra. The paths from DQS CA and DQS CB to DQS_PU and DQS_PD are disabled by the SB signal.

Eight input ports 8 provide bus input to further switching circuits. One switching circuit, comprising three FET switches 20, 22, and 24, is provided for each of the eight input ports. Each set of three FET switches is capable of directing the input from the corresponding bus signal to either an A memory bank port, or a B memory bank port. Furthermore, the bus may be isolated from the memory banks if FET switch 20 is disabled, and, if FET switches 22 and 24 are both enabled, each A port may be connected to a corresponding B port.

Three further control signals are used by the circuit of FIG. 12 to effectuate the switching; a Master Enable Signal 10, a Select Both signal 12, and a Bank Enable Clock signal 14.

Figure 1:
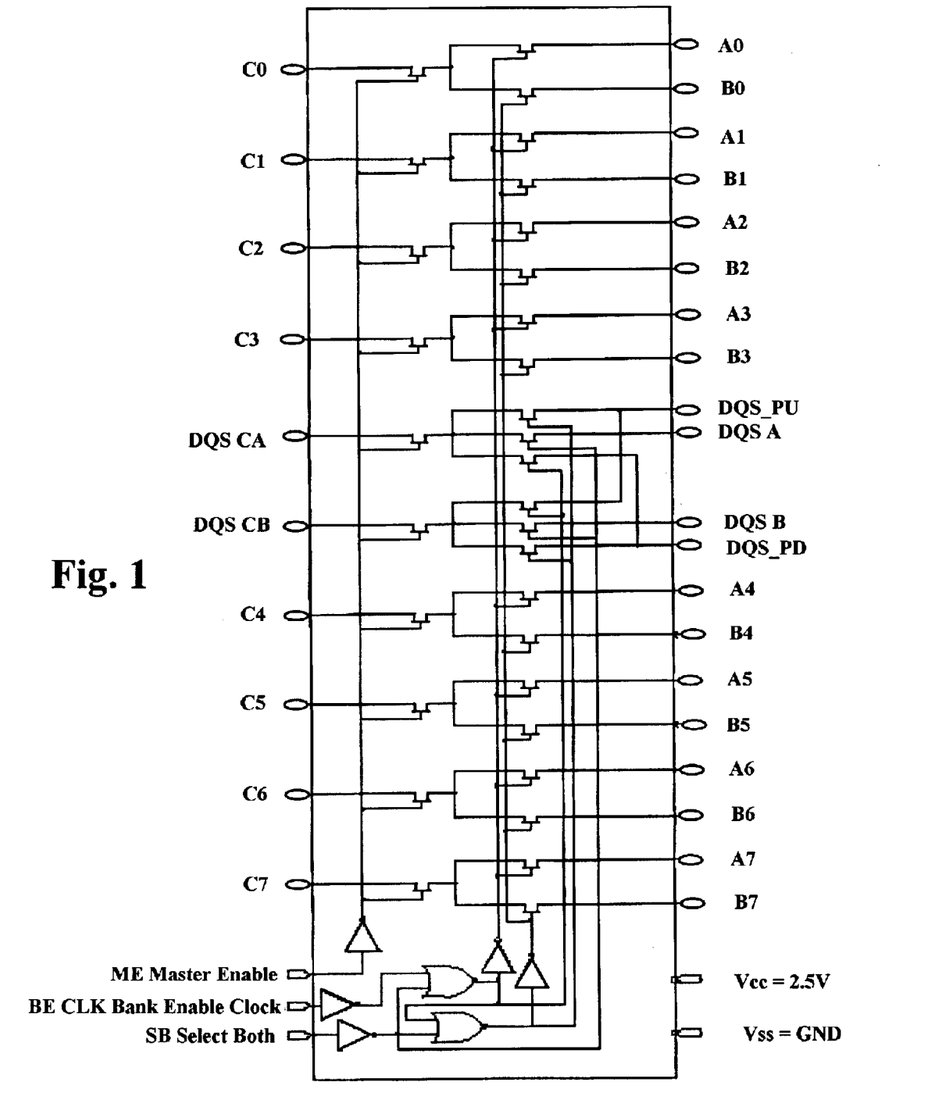
FIG. 1 depicts a schematic diagram of the preferred embodiment of the invention.

A detailed schematic of the above-described circuit is shown in FIG. 1. Detailed areas of FIG. 1 are further shown in FIGS. 3 and 4. Consider first the circuit between port Cn, An, and Bn, where n can be any number between 0 and 7. FET switches FS1, FS2, and FS3 in FIG. 3 correspond to FET switches 20,22, and 24 in FIG. 12.

Figure 3:
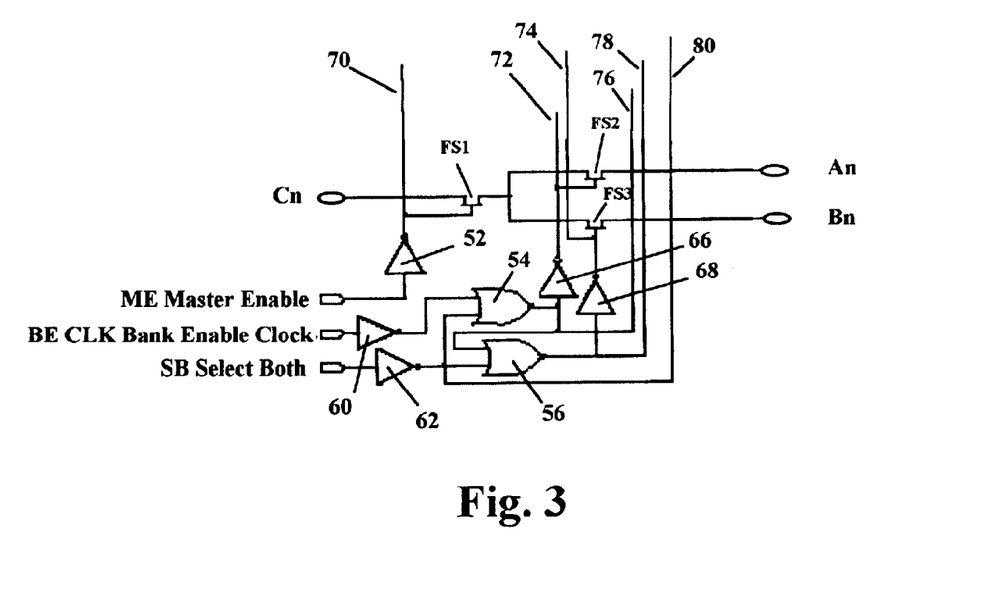
FIG. 3 depicts a schematic diagram of a sub-circuit of FIG. 1.
Figure 4:
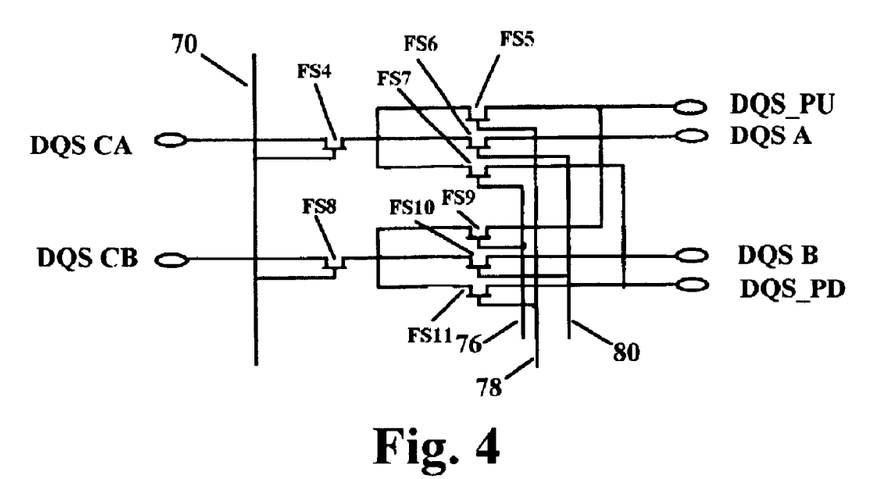
FIG. 4 depicts a schematic diagram of a further sub-circuit of FIG. 1.

FIG. 4 shows the detail of the Switch Control subcircuit 26 of FIG. 12. This Switch Control controls all of the FET switches of FIG. 1. It comprises inverters 52, 60, 64; 66, and 68, and NOR gates 54 and 56. The outputs of this Switch Control subcircuit are control signals 70, 72, 74, 76, 78, and 80, as shown in FIG. 3.

The Switching Strobe Circuitry 18, 28 of FIG. 12 is shown in detail in FIG. 4. As previously stated, the signals which control the states of FET switches FS4 through FS11, are the same control signals 70, 72, 74, 76, 78, and 80 as shown in FIG. 3.

Referring again to FIGS. 2 and 3, it is seen that when the ME signal is FALSE and the SB signal TRUE, port An and port Bn are controlled by the BE signal. The duration of port An and port Bn connected to port Cn is determined by the duty cycle or pulse width of the BE line in oscillation. Normally in a read operation from port An and port Bn only a portion of the signal is sampled from each port and allowed to appear on port Cn. The signals at port A and port B may have some phase difference as shown. In addition, each signal may have some phase jitter in the front end and back end of the pulse. The BE signal is adjusted to allow sampling of the signal from each port passed the point of jitter and uncertainty.

Referring again to FIG. 5b, the FET switch itself comprises three terminals: a gate 5, which controls the switch to either an ON state or an OFF state, a source 1, and a drain 3, which are connected in the ON state, and isolated from each other in an OFF state. Because the FET is bi-directional, it is immaterial whether any particular FET is oriented so that a signal flows from source to drain, or from drain to source. Therefore, it will be assumed, throughout this disclosure, that the source and drain of any particular FET switch may be interchanged without any functional effect on the invention.

Referring again to FIG. 3, the three-state element is constructed of three FET switches. The switches are arranged in configuration like the letter Y. The base of the "Y" is FET switch FS1, with its source connected to port Cn, and drain connected to the source of FET switches FS2 and FS3. The drain of FET switch FS2 is connected to Port An, while the drain of FET switch FS3 is connected to Port Bn.

Figure 2:
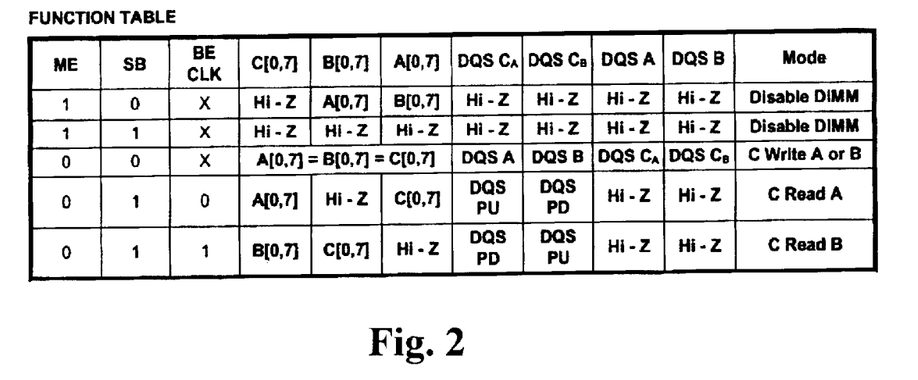
FIG. 2 depicts a truth table of the schematic diagram of FIG. 1.

This configuration of FET switches allows the circuit of FIG. 1 to provide a variety of high-speed connections between the bus signals attached to the Cn ports with the memory bank ports An and Bn. These states are shown in the truth table of FIG. 2. As seen in FIG. 2, a bus port can be connected either to the corresponding A memory port, or to the corresponding B memory port. Alternatively, all three ports can be isolated from each other; or, as a further alternative, the A port may be connected to the corresponding B port, with both A and B ports isolated from the bus port C.

The Bus Enable BE signal controls the duration of the DQS_PU and DQS_PD which are gated through to the DQS CA pin. Furthermore, strobe signals are generated which appear at DQS CA and DQS CB. These signals are exactly in phase with the data signals and are generated by similar FET switches from the same silicon substrate. The small variations that may exist in phase are very trivial and for all practical purposes are not influencing the operation of phase synchronization of data and associated strobe.

FIG. 2 also shows the combinations of inputs which produce the synchronization signals DQS_CA and DQS_CB, and the pull-up signal DQS_PU, which attaches the corresponding port to power supply voltage Vcc, and the pull-down signal DQS_PD, which attaches the corresponding port to ground GND.

Note that this circuitry provides for a high impedance of FET switch FS1, isolating port Cn from ports An and Bn. This feature is very important when multiple FET switches are connected on the same data bit of the Data Bus. It prevents the loads from port An and port Bn from influencing the quality of the data bit signal on the Data Bus and thus the speed at which data can be transferred.

When port Cn is isolated from ports An and Bn in this manner, port An can be connected to port Bn by activating the SB line. This is a very important feature, as it allows communication of port An and port Bn at any speed it is desired and without affecting the main Bus at port Cn. This feature does not exist in any industry FET switch implementation currently or previously available.

Figure 10:
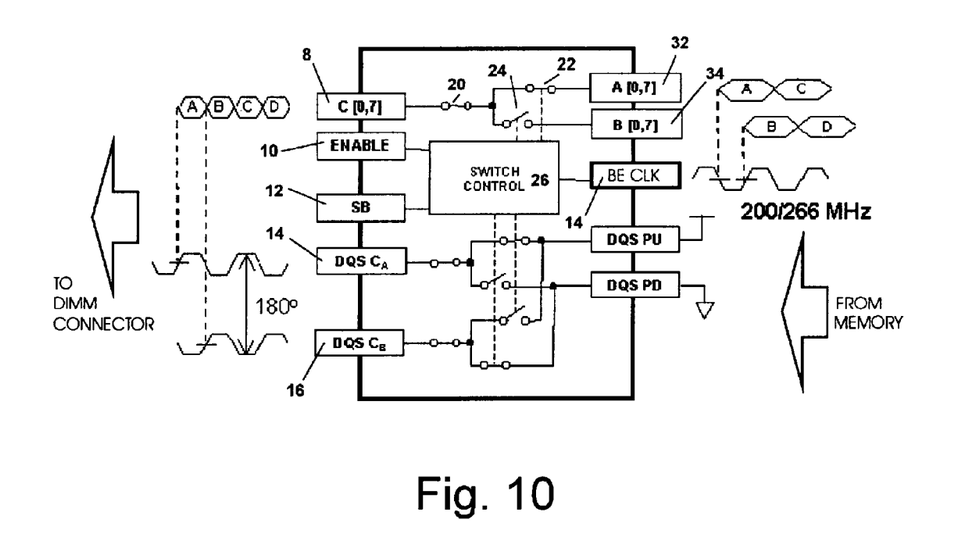
FIG. 10 a block diagram of the current invention reading from memory to the data bus.
Figure 11:
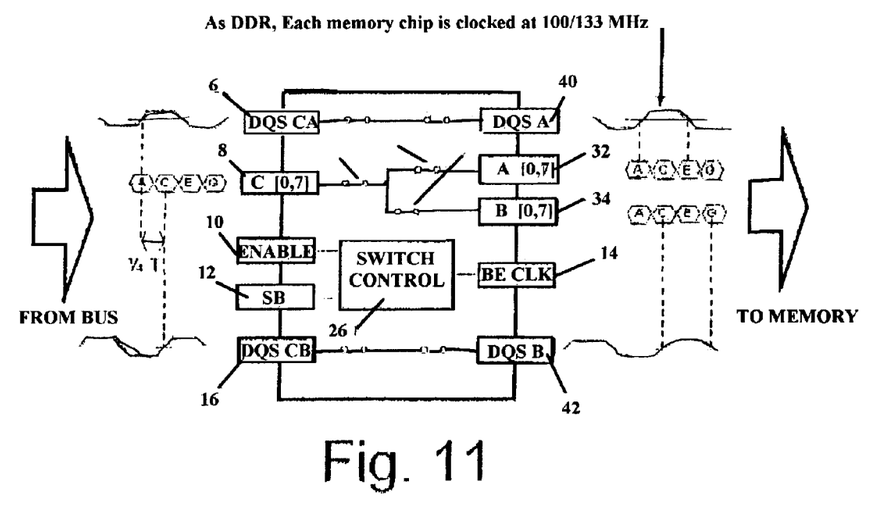
FIG. 11 depicts a block diagram of the current invention reading from the data bus to the memory.

FIG. 10 shows how the invention is used when transferring data from memory to the data bus via the DIMM connector. The FET switches 20 and 22 are alternated between a TRUE, or connected state, and a FALSE, or isolated state, while Switch Control circuitry switches Cn from An to Bn. The control signal SB is maintained TRUE, while Complementary DQS signals (edge-aligned) are generated by the Switch Control 26. FIG. 11 shows how the invention is used when transferring data from the data bus via the DIMM connector to the memory. The memory bank ports An 32, Bn 34, and Cn 8 are all connected together. One-quarter-period T shifted DQS signals are passed through (center-aligned): port DQS CA 6 is connected to port DQS A 40, and port DQS CB 16 is connected to port DQS B 42.

Figure 8A:
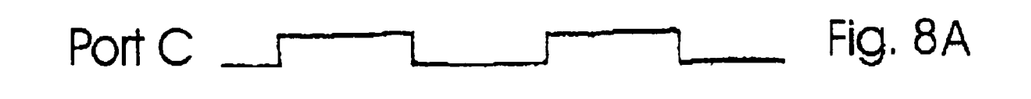
FIGS. 8a through 8g depict the waveforms generated by the circuit of FIG. 1 when data is written from the data bus to one of the memory banks.
Figure 8B:
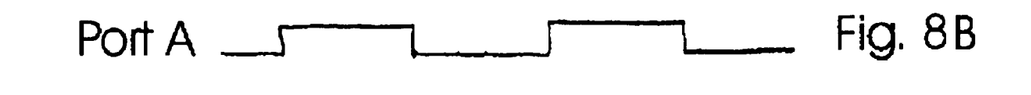
Figure 8C:
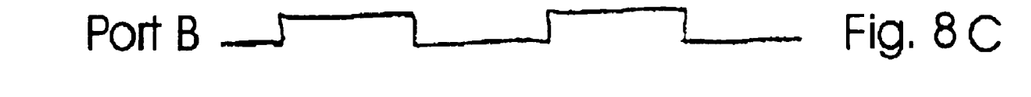
Figure 8D:
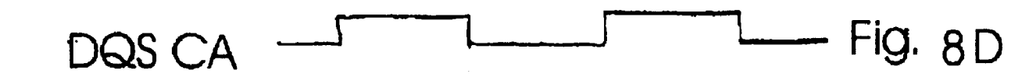
Figure 8E:
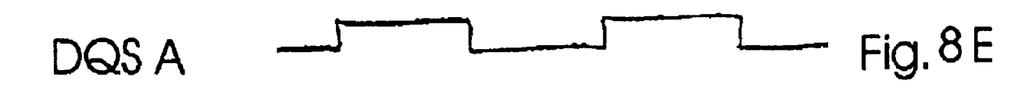
Figure 8F:
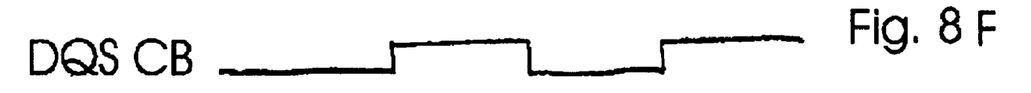
Figure 8G:
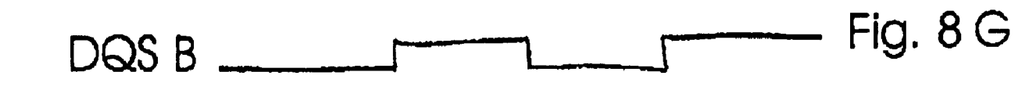

Referring now to FIGS. 8a thorough 8g, the signals at the various ports are shown when the Bus Enable signal is False, while the Select Both and Master Enable are both TRUE. In this timing diagram it is shown that all of the FET switches are enabled. Whatever signal is at port C it appears without alteration on ports An and Bn. Whatever appears on port DQS CA appears on port DQSA and whatever appears on port DQS CB appears on port DQSB. This operation is suitable writing of data from the bus directly to memory banks A and B.

Referring now to FIGS. 6a through 6l, the timing diagram displays the signals resulting when the Master Enable signal is TRUE, and data is being read from either the A or B memory bank to the data bus C. In this figure, the signal at Ports A and B produces an output 6F and 6G, respectively, which is synchronized with the Bus Enable signal of FIG. 6E. The DQS CA and DQS CB signals 6H, 6I, respectively, are likewise synchronized with the Bus Enable signal. It is seen that these strobe signals are generated without any delay relative to the data signals which appear on the Port C bus 6F, 6G.

Figure 7A:
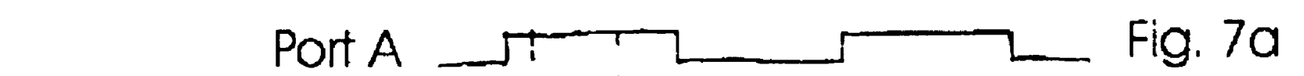
FIGS. 7a through 7f depict the waveforms generated by the circuit of FIG. 1 when data is read from one of the memory banks to the data bus, when the Master Enable Signal is false.
Figure 7B:
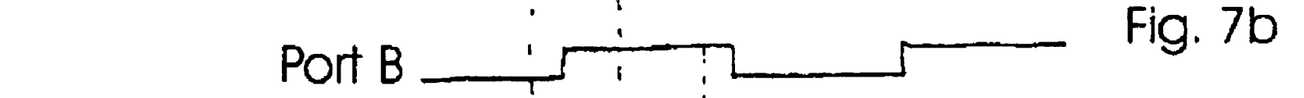
Figure 7C:
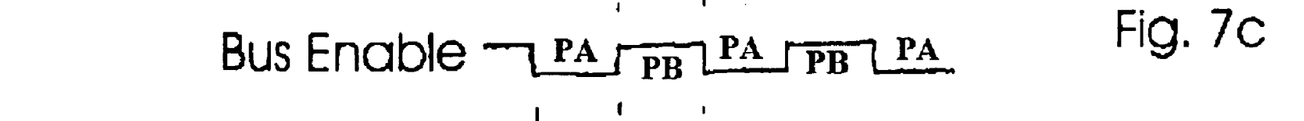
Figure 7D:
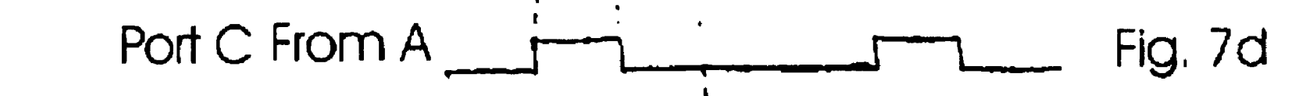
Figure 7E:
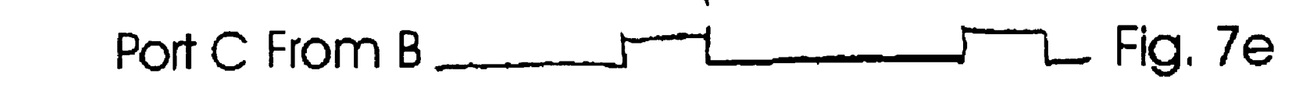
Figure 7F:
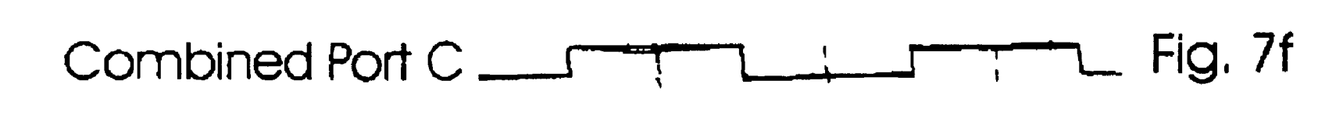

Referring now to FIGS. 7a through 6l, the timing diagram displays the signals resulting from a read operation from Ports A and B to data bus via Port C. The Bus Enable signal is shown in FIG. 7c, and the data read onto Port C from Port A, as seen in FIG. 7d, is synchronized with the Bus Enable signal, although the waveform at Port A is significantly different, as seen in FIG. 7a. Likewise, the data from Port B, as shown in FIG. 7b, is synchronized with the Bus Enable signal, producing the waveform shown in FIG. 7e. As a result, the Combined data signals, as shown in FIG. 7f, are compressed, and produce an output on the data bus at twice the rate at which data is read from the individual memory ports.

Referring finally to FIGS. 8a through 8g, the waveforms of the various ports are shown when writing to the A and B memory banks from the data bus via the C ports. Each C port is connected to the corresponding A and B port, as reflected in the waveforms of FIGS. 8a, 8b, and 8c. Similarly, both the A bank and B bank strobe signals are passed through directly through the Strobe Switching Circuits 18, 26, as is seen in the waveforms of FIGS. 8d through 8g.

It will be apparent that improvements and modifications may be made within the purview of the invention without departing from the scope of the invention defined in the appended claims.

What is claimed is:

1. A tri-directional, high-speed switching circuit, comprising a multiplicity of n bus ports C, a bank A port corresponding to each bus C port, a bank B port corresponding to each bus C port, a DQS A port, a DQS_PU port, a DQS B port, and a DQS_PD port, and further comprising logic operating on control signals ME, BE, and SB, each of which has a TRUE state and a FALSE state, and configured so that:
    (a) when ME is TRUE and SB is FALSE, then:
        (i) each C port is isolated from the rest of the circuit;
        (ii) each B port is connected to the corresponding A port;
        (iii) DQS_CA is isolated from the rest of the circuit;
        (iv) DQS_GB is isolated from the rest of the circuit;
        (v) DQS A is isolated from the rest of the circuit; and
        (vi) DQS B is isolated from the rest of the circuit, and
    (b) when ME is TRUE and SB is TRUE, then each C port, each B port, the DQS_CA port, the DQS_CB port, the DQS A port and the DQS B port are all isolated from the rest of the circuit, and
    (c) when ME is FALSE and SB is FALSE, then:
        (i) each C port is connected to the corresponding A port;
        (ii) each B port is connected to the corresponding A port;
        (iii) DQS_A is connected to the DQS A port; and
        (iv) DQS_CB is connected to the DQS B port; and
    (d) when ME is FALSE and SB is TRUE, and BE CLK is FALSE, then:
        (i) each C port is connected to the corresponding A port;
        (ii) each B port is isolated from the rest of the circuit;
        (iii) DQS_CA is connected to the DQS-PU port;
        (iv) DQS_CB is connected to the DQS_PD port;
        (v) DQS A is isolated from the rest of the circuit; and
        (vi) DQS B is isolated from the rest of the circuit, and
    (e) when ME is FALSE and SB is TRUE, and BE CLK is TRUE, then:
        (i) each C port is connected to the corresponding B port;
        (ii) each A port is isolated from the rest of the circuit;
        (iii) DQS_CA is connected to the DQS_PD port;
        (iv) DQS_CB is connected to the DQS_PU port;
        (v) DQS A is isolated from the rest of the circuit; and
        (vi) DQS B is isolated from the rest of the circuit.

2. A first tri-directional, high-speed switching element for communicating between any two members of the group which consists of a computer data bus, a first memory bank, and a second memory bank, comprising:
    (a) first port, Cn, a second port An, and a third port Bn;
    (b) a first LET switch comprising a first gate and a first drain, and further comprising a first source connected to said first port Cn
    (c) a second FET switch comprising a second gate and a second source connected to said first drain, and further comprising a second drain connected to said second port An;
    (d) a third LET switch comprising a third gate and a third source connected to said first drain, and further comprising a third drain connected to said third port Bn; and
    (e) a multiplicity of control signal electrical connections between a first control sub-circuit and the gates of the first, second, and third FET switches which command either:
        (i) a connection between port An and port Bn with port Cn isolated from the other two ports; or
        (ii) a connection between port An and port Cn with port Bn isolated from the other two ports; or
        (iii) a connection between port Cn and port Bn with port An isolated from the other two ports.

3. A high-speed, tri-directional switching circuit for communicating between any two members of the group which consists of a computer data bus, a first memory bank, and a second memory bank, and comprising:
    (a) a multiplicity of first tri-directional, high-speed switching elements in accordance with claim 2;
    (b) a second tri-directional, high-speed switching element which generates synchronization signals for use in conjunction with communications generated by the first tri-directional, high-speed switching elements, and comprising:
        (i) a first port, DQS_CA, a second port DQS A, and a third port DQS_PU, a fourth port, DQS_CB, a fifth port DQS B, and a sixth port DQS_PD;
        (ii) a fourth FET switch comprising a gate, a source and a drain, the source connected to DQS_CA;
        (iii) a fifth, a sixth, and a seventh FET switch, each of which comprises a source, a gate, and a drain, and wherein:
            (A) the sources of the fifth, a sixth, and a seventh FET switches are connected together, and are further connected to the drain of the fourth FET switch,;
            (B) the drain of the fifth FET switch is connected to DQS_PU;
            (C) the drain of the sixth FET switch is connected to DQS A;
            (D) the drain of the seventh FET switch is connected to DQS_PD;
        (iv) an eighth FET switch comprising a source and a drain, the source connected to DQS_CB; (v) a ninth, a tenth, and an eleventh FET switch, each of which comprises a source, a gate, and a drain, and wherein:
            (A) the sources of the ninth, the tenth, and the eleventh FET switches are connected together, and are further connected to the drain of the eighth FET switch;

(B) the drain of the ninth FET switch is connected to DQS_PU;

(C) the drain of the tenth FET switch is connected to DQS B; and (D) the drain of the eleventh FET switch is connected to DQS_PD; and (c) the control sub-circuit, and wherein the gate of each PET switch of the second high-speed switching element is connected to an output of the first control sub-circuit.

4. The tri-directional, high-speed switching circuit of claim 3, further comprising control logic circuitry such that the results of claim 1 are accomplished.

5. The tri-directional, high-speed switching circuit of claims 1, 2, 3 or 4 implemented by microelectronic techniques, and in the form of a single semiconductor chip.

6. A tri-directional, high-speed switching circuit, in accordance with claim 2, and further comprising logic operating on control signals ME, BE, and SB, each of which has a TRUE state and a FALSE state, and configured so that:

(a) when ME is TRUE and SE is FALSE, then: (i) Port Cn is isolated from the rest of the circuit; and (ii) Port Bn is connected to Port An, and (b) when ME is TRUE and SB is TRUE, Port An, Port Bn and Port Cn are isolated from each other, and (c) when ME is FALSE and SB is FALSE, then Port Cn is connected to Port An and to Port Bn, and (d) when ME is FALSE and SB is TRUE, and BE CLK is FALSE, then: (i) Port Cn is connected to Port An, and (ii) Port Bn is isolated from the rest of the circuit, and (e) when ME is FALSE and SB is TRUE, and BE CLK is TRUE, then: (i) Port On is connected to Port Bn, and (ii) Port An isolated from the rest of the circuit.

7. A method for performing tri-directional, high-speed electronic switching comprising:

(a) configuring an electronic element comprising a first port, Cn, a second port An, and a third port Bn;

(b) including in the electronic element a first FET switch comprising a first gate and a first drain, and further comprising a first source connected to said first port Cn (c) further including in the electronic element a second FET switch comprising a second gate and a second source connected to said first drain, and further comprising a second drain connected to said second port An; and (d) further including in the electronic element a third FET switch comprising a third gate and a third source connected to said first drain, and further comprising a third drain connected to said third port Bn, so that in a first mode the element effects a high speed connection between port An and port Bn with port Cn isolated from the other two ports, in a second mode the element effects a high speed connection between port An and port Cn with port Bn isolated from the other two ports, and in a third mode the element effects a high speed connection between port Cn and port Bn with port An isolated from the other two ports.

* * * * *